(12) United States Patent
Naffziger

(10) Patent No.: US 6,313,675 B1
(45) Date of Patent: Nov. 6, 2001

(54) DELAY LOCKED LOOP DRIVER

(75) Inventor: Samuel D Naffziger, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/510,273

(22) Filed: Feb. 21, 2000

(51) Int. Cl.⁷ ..................................... H03L 7/06
(52) U.S. Cl. .................. 327/158; 327/278; 327/156; 327/157
(58) Field of Search .................. 327/156, 157, 327/158, 141, 147, 148, 149, 236

(56) References Cited

U.S. PATENT DOCUMENTS 5,973,524 * 10/1999 Martin ................................... 327/158
6,150,887 * 11/2000 Yamaguchi .......................... 327/156

* cited by examiner

Primary Examiner—Dinh T. Le

(57) ABSTRACT

The present invention provides an improved, efficient DLL design. In one embodiment, it includes a voltage controlled delay line, a phase comparator, and a dynamic bias source. The delay line has an associated delay that is controllably adjusted by a received control signal. The delay line also has an input for receiving a reference signal and one or more outputs for providing one or more delayed versions of the reference signal. The phase comparator is operably connected to the delay line in a closed loop fashion for controlling the control signal based on the phase difference between the reference signal and one of the one or more delayed reference signal versions to cause the delay line to generate an output delayed reference signal that is in synch. with the reference signal but delayed from it by a predetermined quantity. The dynamic bias source provides power to the delay line as it is needed so that the control signal is not adversely affected by changes in the delay lines power demands.

16 Claims, 3 Drawing Sheets

DELAY LOCKED LOOP DRIVER

TECHNICAL FIELD

The present invention generally relates to the field of integrated circuit design. In particular, the present invention relates to delay locked loops and delay line circuits.

BACKGROUND

Delay lock loops ("DLL" s) are a commonly-used technology in integrated circuits. For a description of conventional DLL technology, reference may be made to the IEEE Journal of Solid State Circuits, Vol. 31, No. 11, 11/96. DLL circuits are used in many applications such as in clock drivers and input/output devices. DLL clock drivers can provide a controllably delayed clock output from an input reference clock signal. Such DLL (or similarly, Phase Lock Loops, PLL) clock drivers are ubiquitous in integrated circuit designs. In some applications, they include multi-stage delay lines with selectable taps from the various delay stages to allow the device to generate an output having preselected delay from a range of selectable delays from the input reference clock. With such DLL driver circuits, important performance parameters include low jitter (supply noise rejection), consistent performance within the operational environment, and delay accuracy.

FIG. 1 shows a circuit block diagram of a conventional DLL driver 50. DLL driver 50 includes phase comparator 55, charge pump 60, buffer 65, voltage controlled delay ("VCD") 70, and current source 75. The VCD 70 generates a Delayed Ref. Clock signal 71 that is delayed from an input Ref. Clock signal 57 by an amount based on a Delay Select input 73 at the VCD 70. The phase comparator 55 compares the phase difference between Reference Clock 57 and a Delay Feedback signal 77. Based on this phase difference, the phase comparator 55 causes the charge pump to either increase or decrease its generated output control voltage $V_{ctl}$, which is buffered at buffer 65 to produce a buffered control voltage $V_{bctl}$ that causes the VCD to either increase or decrease the phase of Delay Feedback 77 to force its phase to be locked with Ref. Clk. 57. The Delayed Ref. Clk. signal 71 is generated from this Delay Feedback signal 77 and thus, it too becomes phase locked with Ref Clk. 57 and delayed from it by a preselected quantity. In this manner, a Delayed Ref. Clock signal is produced with a preselected, fixed delay from the Reference Clock input. Buffer 65 is needed to ensure that the charge pump's output control voltage Vctl is not affected by changes in the VCD's supply current needs. The current source 75 (and/or buffer 65—they may be one in the same) provide the VCD 70 with its operating current. With buffer 65responding to changes in the current demand of VCD 70, a substantially fixed amount of current is provided to it. For reducing jitter, filtered supply voltages may be used for any or all of the component blocks.

Unfortunately, such conventional DLL drivers tend to be large in terms of their aggregate size relative to the other components within an IC device. Among other reasons, this can be attributed to VCD circuits that consume relatively large amounts of current, robust phase comparator/charge pump configurations, and large capacitors that are needed to sufficiently filter the various filtered voltage supplies. Large current consumption is generally an ancillary characteristic of a VCD that produces a signal with an accurate absolute delay from the reference signal. Such delay circuits require robust current sources and large capacitors for adequate filtering.

Accordingly, what is needed is an improved, more efficient DLL and/or delay line circuit design.

SUMMARY OF THE INVENTION

The present invention provides an improved, efficient DLL design. In one embodiment, it includes a voltage controlled delay line, a phase comparator, and a dynamic bias source. The delay line has an associated delay that is controllably adjusted by a received control signal. The delay line also has an input for receiving a reference signal and one or more outputs for providing one or more delayed versions of the reference signal. The phase comparator is operably connected to the delay line in a closed loop fashion for controlling the control signal based on the phase difference between the reference signal and one of the one or more delayed reference signal versions to cause the delay line to generate an output delayed reference signal that is in synch with the reference signal but delayed from it by a predetermined quantity. The dynamic bias source provides power to the delay line as it is needed so that the control signal is not adversely affected by changes in the delay line's power demands.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION

Figure 1:
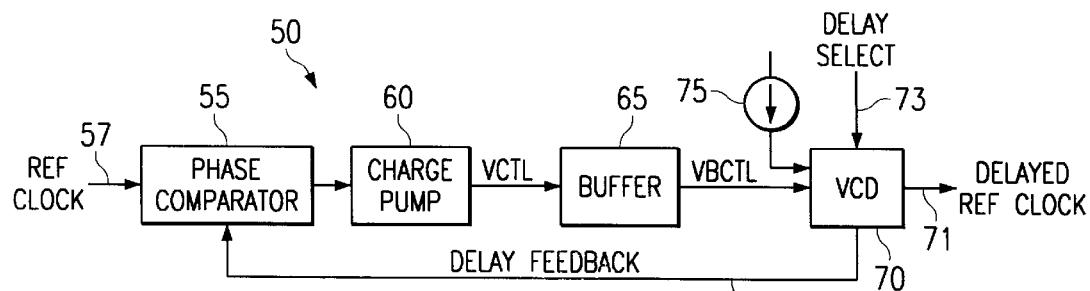
FIG. 1 shows a block diagram of a prior art delay locked loop driver.
Figure 2:
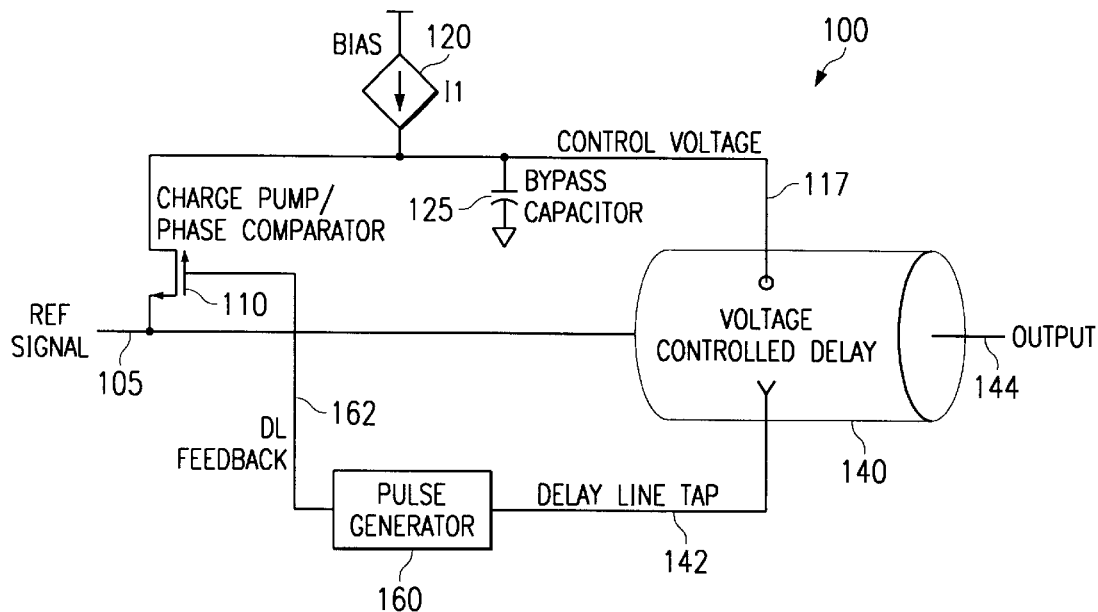
FIG. 2 shows a block diagram of an embodiment of a delay locked loop driver of the present invention.

FIG. 2 shows a block diagram of one embodiment of a DLL driver 100 of the present invention. DLL 100 generally comprises charge pump/phase comparator (phase comparator) 110, bias source 120, bypass capacitor 125, voltage controlled delay line 140, and pulse generator 160. Phase comparator 110 has inputs for receiving a reference signal (e.g., a reference clock) 105 and a delay line feedback signal 162. It also includes an output for modifying a control voltage 117 that corresponds to the phase difference between the reference signal 105 and delay line feedback signal 162. The voltage controlled delay line (delay line) 140 has inputs for receiving the reference signal 105 and the control voltage 117. It also has an output for providing a delay line tap signal 142 to the pulse generator 160, which in turn, provides the delay line feedback signal 162 to the phase comparator 110. Delay line 140 also has an output 144 for providing a delayed version of the reference signal 105 delayed by a predetermined quantity (e.g., a preselected fraction of the reference signal's period). The bypass capacitor 125 is connected between the control voltage signal 117 and a reference ground. The bias source 120 is also operably connected to the control voltage signal 117 for providing power to the delay line 140.

In the depicted embodiment, phase comparator 110 is composed of a single NFET transistor, which also functions as the charge pump for this delay locked loop. Its gate is connected to the delay line feedback signal 162; its source is connected to the reference signal 105; and its drain provides the control voltage 117, which controls the delay line 140. Delay line 140 includes a chain of delay stages for delaying the reference signal input. The delay line tap signal 142 is taken from one or more of these stages and provided to the pulse generator 160 for generation of a pulse that stays on for the time delay between the "tapped" stages. The delay line output 144 outputs the signal from a preselected one of these delay stages. Thus, once the delay line feedback signal is synched with the reference signal, the outputted delayed reference signal at 144 is also in synch with the reference signal but delayed as desired.

The control voltage powers the delay line and controls the delay of the delay stages. the delay increases as the control voltage 117 decreases. Likewise, as the control voltage decreases, the imposed delay increases. The bias source 120 is a dynamic current source for providing the delay line 140 with current proportional to the current consumed by the delay line 140. That is, it supplies current to the delay line 140 on demand, plus a fixed "offset current." This offset current ensures that the control voltage increases in the case of the reference clock leading the feedback clock as described below. It also implies that the balanced condition for the DLL has the feedback clock leading the reference clock by a small amount, sufficient to source this offset current from the charge pump/phase comparator. The control voltage should only be modified by the phase comparator's sensing a difference in phase between the reference signal 105 and the delay line feedback 162. Thus, with bias source 120, a buffer is not required between the phase comparator 110 and the delay line 140. To stabilize the control voltage, bypass capacitor 125 is provided between the control voltage and ground.

In operation, the phase comparator 110 forces the delay line 140 to generate an internal delay signal having a cycle that conforms to and is synchronous with that of the reference signal by forcing the delay line feedback pulse to synchronize with the reference signal. Assume that the reference signal is a periodic clock. This reference clock propagates through the delay line 140 causing the delay line 140 to generate a delay line feedback clock through the pulse generator 160. If the reference clock lags the feedback clock, the NFET will turn on (with a High at its gate and a Low at its source), which causes the control voltage to decrease (or remain low) corresponding to charge being extracted from the control voltage. Conversely, when the reference clock leads the feedback clock, the control voltage is increased with the NFET turning off. This causes charge to be pumped into the delay line 140 from the bias due to the additional "offset current." In this manner, the delay is decreased when the reference signal is ahead of the delay line feedback signal, and the delay is increased when the feedback signal leads the reference signal. This forces the cycle time of the delay line clock to conform to that of the reference clock. It also causes the delay line feedback signal to be substantially synchronized with the reference signal. The output at 144 is taken from a selected delay stage within the delay line to produce the delayed version of the reference clock having the desired phase offset (or delay).

Figure 3A:
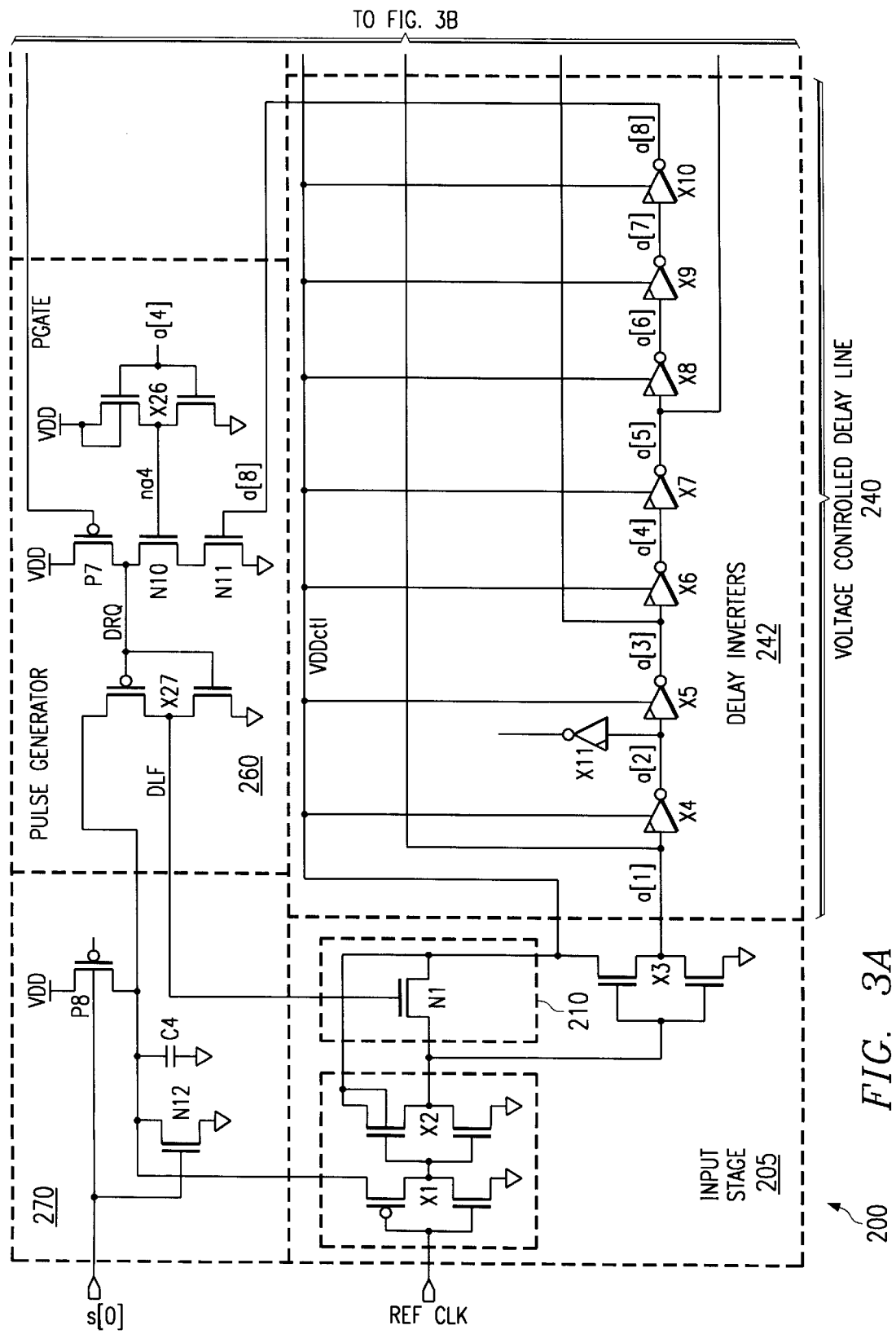
FIGS. 3A and 3B show a schematic representation of one embodiment of a delay locked driver circuit of the present invention.
Figure 3B:
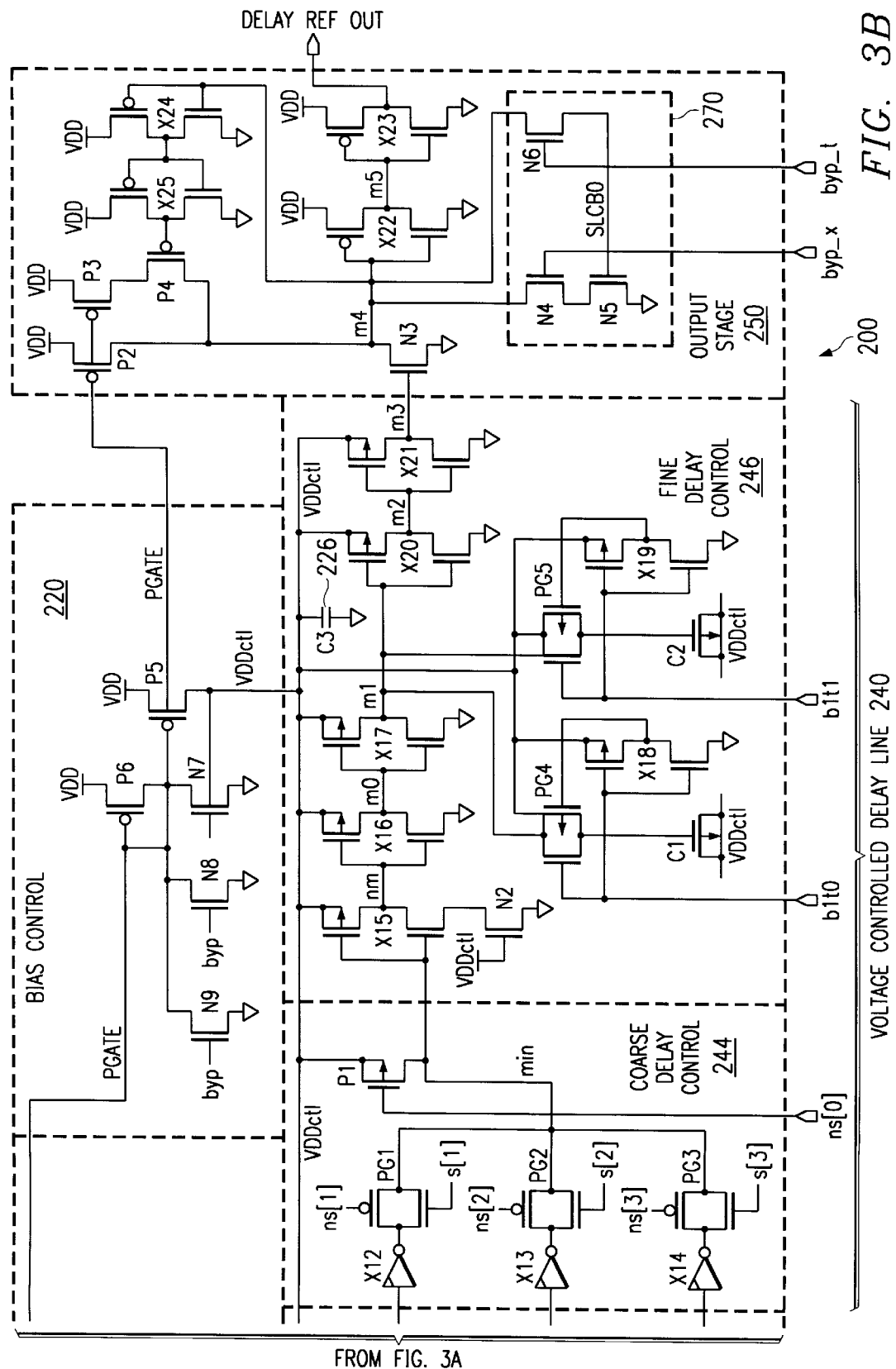

FIGS. 3A and 3B show a schematic diagram of a circuit 200 for implementing one embodiment of the DLL of FIG. 2. Circuit 200 can generally be broken down into its functional components, which include an input stage 205, phase comparator 210, bias control source 220, bypass capacitor 225 (C3), voltage controlled delay line 240, output stage 250, and a pulse generator 260. Circuit 200 also includes bypass/power supply portions 270. In the following description of the actual circuits that make up these blocks, components are referenced as follows: P# for PFETs, N# for NFETs, X# for conventional inverters comprising a PFET and an NFET with their gates and drains tied together, PG# for passgates, and C# for capacitors.

The input stage 205 includes inverters X1 and X2 in series for buffering a reference clock ("Ref. Clk.") signal to the phase comparator 210. The input stage 205 also includes inverter X3 for providing an inverted Ref Clk signal to the delay line 240. The phase comparator 210 is implemented with NFET N1, which functions as both the phase comparator and charge pump for DLL circuit 200. The source of N1 is connected to the output of inverter X2 for receiving Ref. Clk; while its gate is connected to delay line feedback ("DLF") from the pulse generator 260. The drain of N1 provides the control voltage labeled VDDctl.

The bias control source 220 includes NFETs N7–N9 and PFETs P5 and P6. With its gate and drain tied together, P6 functions as a biasing resistor for N7. Thus, the value of "pgate" at the drain of N7 is controlled by VDDctl, which is input to the gate of N7. Thus, the function of N7 and P6 together is to set and control the value of the pgate signal. As VDDctl increases, pgate decreases. P5 functions as a source for providing current to the delay line 240 through VDDctl. Its source is connected to a supply voltage VDD, its drain is connected to VDDctl, and its gate is driven by pgate. As pgate decreases, $V_{gs}$ on P5 decreases and thus it sources more drive current into the delay line 240. Accordingly, as VDDctl increases, the amount of current supplied from the bias control source 220 (and into delay line 240) is increased. In one embodiment of this circuit, N7/ P6 and P5 are designed so that 0.1 VDD≦pgate≦0.5VDD and 0.5V≦VDDctl≦0.9V.

Bypass capacitor 225 (C3) is connected between VDDctl and ground to stabilize the control voltage, VDDctl, which is not only used to power the delay line 240, but also to control its delay responsive to phase comparator 210.

NFETs N8 and N9 merely serve as switches for shutting down the bias control source 220 when the "byp" signal is activated High, which causes pgate to go to approach ground.

The delay line 240 generally comprises a delay inverters section 242, a course delay control section 244, and a fine delay control section 246. The delay inverters 242 and course delay control 244 sections include inverters X4 through X14 and passgates PG1 through PG3. Inverters X4 through X10 are sequentially configured to form a seven stage delay line having input/outputs a[1] to a[8], respectively. The inverted Ref Clk. signal is inputted from X3 of the input stage into the delay line at input a[1] of inverter X4. An open-ended inverter X11 is tied to a[[2] for balancing delay line loading in view of a tap output connection from a[4] to the pulse generator 260 (which will be addressed below).

The course delay control section comprises inverters X12 to X14 and passgates PG1 to PG3. These devices form a non-decoded, three-input multiplexer for selection of one of three delay line tap options: a[1], a[3], or a[5], which corresponds to three separate course delay settings. Output a[1] is connected to the input of X12 whose output is connected to the input of passgate PG1; output a[3] is connected to the input of X13 whose output is connected to the input of passgate PG2; and output a[5] is connected to the input of X14 whose output is connected to the input of passgate PG3. The outputs of the three passgates are each connected to a common "min" output. Passgates PG1 to PG3 are controlled by three separate sets of complementary select lines: s[1]/ns[1], s[2]/ns[2], and s[3]/ns[3]. Thus, with activation of one of thee three select line sets, one of the three delay line taps (a[1], a[3], or a[5]) is "selected" to be passed through to the min output, which provides the selected tap to the fine delay control section 246.

The fine delay control section 246 includes inverters X15 to X21, capacitors C1, C2, NFET N2, and passgates PG4 and PG5. The min signal (from the course delay control section 244) is connected to the input of inverter X15. Inverters X15 through X17 are connected in series for providing additional delay; similarly, NFET N2 is connected in series with the NFET of inverter X15 for providing it with additional delay. The output at X17 is connected to the inputs of passgate PG4, passgate PG5 and inverter X20. Capacitor C1 is connected between the output of passgate PG4 and ground. Likewise, capacitor C2 is connected between the output of passgate PG5 and ground. External fine select inputs bit 0 and bit 1, respectively, are connected to the non-inverting control inputs of passgates P4 and P5 and to the inputs of inverters X18 and X19, which provide the inverting control inputs for passgates PG4 and PG5, respectively. Inverters X20 and X21 are connected in series for delay and to provide a non-inverting buffer to pass ml through to the output stage 250 at m2. With the activation of either bit 0 or bit 1, capacitor C1 or C2, respectively, is selectively connected to signal ml delaying it by an amount corresponding to the value of the selected capacitor. In this manner, fine delay tuning is achieved.

The output stage 250 generally includes PFETs P2–P4, NFET N3, and inverters X22 to X25. N3 functions as an inverting driver for driving the delayed signal m3, which is connected to its gate from the fine delay control section 246. the inverted signal is driven through to N3's drain as signal m4. Signal m4 is then buffered through series-configured, buffering inverters X22/X23 to Del. Ref. Out., which provides the desired delayed reference output signal. P2 is connected in series between VDD and N3 with its drain tied to the drain of N3. It is a relatively weak PFET that is designed to nominally be turned on. It serves to pull up m4 when transitioning from a Low to a High state, yet it is weak enough in a "drive fight" with N3 to allow N3 to pull m4 from High to Low. P3 and P4 are connected in series with one another between VDD and N3's drain. They serve to provide current to transition m4 from Low to High. With P4's gate being connected to the output of series-connected delay functioning inverters X24/X25 whose input is connected to m4, they turn on shortly after m4 goes Low in order to condition m4 for a Low to High transition.

Pulse generator 260 includes inverters X26 and X27, NFETs N10 and N11, and PFET P7. P7, N10, and N11 are connected in series with one another to form a conventional NAND gate with inputs at the gates of N10 and N11 and an output at the commonly tied drains of N10 and P7. Inverter X24 is connected between delay line tap output a[4] and the the delay line, and tap 8 is at its end. Thus, if the cycle time of the delay line equals (or is forced to equal) the cycle time of Ref. Clk., then the Low to High pulse at DLF, which is input to the gate of phase comparator N1, will occur approximately at the time the Low to High transition for the next Ref. Clk cycle is input to the source of phase comparator N1. Because the phase comparator/charge pump N1 and the delay line 240 are connected in a closed loop configuration, this condition is forced. That is, the phase comparator N1 forces the signal within the delay line to be in synch. with the Ref. Clk. In addition, it causes the cycle time of the delay line to correspond to that of the Ref. Clk. More accurately, it causes the signal at tap a[5] to be approximately 180 degrees out of phase (but in synch.) with the Ref. Clk. signal. Thus, by simply taking an output from a selected one of the delay line stages, a delayed Ref. Clk. that is delayed by a desired fraction of its period can be attained and sufficiently fine tuned through fine delay control 246.

With circuit 200, the same bypass capacitor (C3)/bias source 220, which isolates the sensitive delay line 240 from the external supplies also provides the means (in connection with phase comparator N1) for adjusting the delay in the delay line through control voltage variation. This greatly reduces the amount of circuitry present in the DLL/delay line. In addition, the phase comparator/charge pump 210, in one embodiment, is implemented with a single NFET, which provides an extremely robust and economical scheme for locking the delay line to a reference signal. These innovations enable the design of a delay line and/or DLL that is very small, highly resistant to supply noise and yet provides very good relative delay control accuracy. These characteristics are ideally suited to individual delay controls for chip input/output pins and clock distribution buffers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, gate input at N10 to provide it with an inverted na[4] input. The other NAND input at N11's gate is connected to delay line tap output a[8]. The NAND output (signal nwy) at the drains of N10/P7 is connected to the input of inverter X27, whose output is connected to the gate of phase comparator N1 to provide it with the DLF signal. Because a[8] is a delayed complement of na[4], the nwy signal will normally be High except when a High to Low pulse is transmitted through the delay inverters 242. When such a pulse is transmitted, nwy goes Low when a[4] goes low and lasts until a[8] goes low. Thus, a High to Low pulse at Ref. Clk causes a High to Low pulse at nwy, which causes a Low to High pulse to be generated at DLF. This will be addressed again when the operation of DLL circuit 200 is discussed below.

The bypass/power supply portions 270 include NFETs N4–N6 and N12, PFET P8, and capacitor C4. P8 and N12 are connected in series (with their drains tied together) between VDD and ground. Filter capacitor C4 is connected between the common drain connection and ground. The gate inputs to P8 and N12 are tied together and connected to an external s[0] input, which is Low when the DLL circuit 200 is operating and High when it is turned off. When s[0] is Low, P8 is turned on to provide power from VDD to VDDX, which supplies the input stage 205. VDDX is filtered by capacitor C4 for among other things filtering supply noise. Conversely, when s[0] goes High, P8 turns off to shut down VDDX. N4 and N3 are connected in series between the drain of N3 (m4) and ground. N6 is connected between the input gate of X24 and the gate of N5. External inputs byp x and byp t are connected, respectively, to the gates of N4 and N6. Thus if either byp x or byp t is High, m4 will be parked at a Low state. Accordingly, for operation of DLL circuit 200, s[0], byp x, and byp t must all be Low.

In operation, as discussed above, when Ref. Clk. transitions from High to Low, a Low to High pulse is eventually produced by the pulse generator 260 at signal DLF. This pulse is approximately (due to delay in the pulse generator 260) initiated when the Ref Clk. H/L transition reaches tap output a[5] (due to the added delay imposed by X26) in the delay line 240 and lasts until the Ref. Clk. transition reaches tap output a[8]. With the depicted delay line 240, which has seven delay line inverter stages, tap 5 is approximately in the center of manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device having a delay locked loop comprising:
    a phase comparator having a first input for receiving a periodic reference signal having an associated cycle time, a second input for receiving a delay line feedback signal, and a first output for providing a control voltage that is indicative of a phase difference between the reference signal and the delay line feedback signal;
    a delay line having a first input for receiving the reference signal, a second input operably connected to the first output of the phase comparator for receiving the control voltage, wherein the delay imposed by the delay line corresponds to said control voltage, a first output operably connected to the second input of the phase comparator for generating the delay line feedback signal from the reference signal, wherein the phase comparator adjusts the control voltage so that the cycle time of the delay line conforms to that of the reference signal, and a second output for providing an output signal that corresponds to the reference signal delayed by a predetermined quantity; and
    a bias source operably connected to the first output of the phase comparator for proving the delay line with current proportional to current that is consumed by the delay line, wherein the control voltage is substantially not affected by changes in current consumption within the delay line.

2. The device of claim 1 wherein the delay line includes one or more delay stages, the device further comprising a pulse generator having an input connected to at least one of the one or more delay stages for receiving at least one delay line tap signal, and an output connected to the second input of the phase comparator for generating the delay line feedback signal.

3. The device of claim 2 wherein the one or more stages include a center stage that is substantially in the center of the delay line and an end stage that is substantially at the end of the delay line, wherein the pulse generator receives delay line tap signals from the center and end stages.

4. The device of claim 1 wherein the phase comparator also functions as a charge pump for the delay locked loop.

5. The device of claim 4 wherein the phase comparator is implemented with a NFET device, the first input of the phase comparator being its gate, the second input of the phase comparator being its source, and the first output being its drain.

6. The device of claim 1 wherein the bias source is connected to the second input of the delay line for providing it with additional current as the control voltage increases.

7. The device of claim 6 further comprising bypass capacitance connected between the control voltage and a reference ground.

8. The device of claim 7 wherein the bypass capacitance is less than 10 pF.

9. The device of claim 1 wherein the delay line is powered from the control voltage in cooperation with the bias source.

10. A delay locked loop (DLL), comprising:
    a voltage controlled delay line having an associated delay that is controllably adjusted by a received control signal, the delay line having an input for receiving a reference signal and one or more outputs for providing one or more delayed versions of the reference signal;
    a phase comparator with an output that is directly connected to the delay line for controlling the control signal based on the phase difference between the reference signal and one of the one or more delayed reference signal versions to cause the delay line to generate an output delayed reference signal that is synchronous with the reference signal but delayed from it by a predetermined quantity; and
    a dynamic bias source connected to the output of the phase comparator for providing power to the delay line as it is needed so that the control signal is not adversely affected by changes in the delay line's power demands.

11. The DLL of claim 10 wherein the phase comparator also functions as a charge pump.

12. The DLL of claim 11 wherein the phase comparator is implemented with a FET device.

13. The DLL of claim 12 wherein the phase comparator is an NFET device.

14. The DLL of claim 10 wherein the delay line is powered by the control signal.

15. The DLL of claim 10 wherein current provided from the bias source is controlled by the control signal.

16. The DLL of claim 10 wherein the comparator is a FET device with its drain connected to the delay line for providing the control signal thereto.

* * * * *